United States Patent [19]

Lunn et al.

[11] Patent Number: 4,638,265
[45] Date of Patent: Jan. 20, 1987

[54] BALANCED VARIABLE REACTANCE CIRCUIT AND METHOD OF PRODUCING THE SAME

[75] Inventors: Gerald K. Lunn, Scottsdale; W. Eric Main, Mesa; Michael McGinn, Scottsdale, all of Ariz.

[73] Assignee: Motorola, Inc., Schaumburg, Ill.

[21] Appl. No.: 740,366

[22] Filed: Jun. 3, 1985

[51] Int. Cl.$^4$ .............................................. H03H 7/48
[52] U.S. Cl. ..................... 333/214; 307/494; 333/216
[58] Field of Search ................... 333/213, 214, 216; 307/490, 494

[56] References Cited

U.S. PATENT DOCUMENTS 4,258,274  3/1981  Nagashima et al. ................ 307/254

FOREIGN PATENT DOCUMENTS 64420  5/1980  Japan ................................. 333/213
64421  5/1980  Japan ................................. 333/213
57515  4/1984  Japan ................................. 333/213

Primary Examiner—Paul Gensler
Attorney, Agent, or Firm—Michael D. Bingham

[57] ABSTRACT

A variable reactance, the value of which is controllable, is produced between a pair of terminals of a variable reactance circuit comprising a pair of current steering circuits. First and second reactive components are coupled respectively between the pair of terminals and the first and second current steering circuits to produce first and second antiphase reactive currents'. The first reactive current is split by the first current steering circuit into first and second antiphased proportional currents. Likewise, the second reactive current is split by the second current steering circuit into third and fourth antiphased proportional currents with said first and third currents being antiphased with respect to each other. The first reactive current is summed at a first one of the pair of terminals with said first and third currents while the second reactive current is summed at the second one of the pair of terminals with said second and fourth currents to produce the variable reactance across the terminals.

19 Claims, 7 Drawing Figures

BALANCED VARIABLE REACTANCE CIRCUIT AND METHOD OF PRODUCING THE SAME

BACKGROUND OF THE INVENTION

The present invention relates to reactance circuits and, more particularly, to a circuit and method for producing a balanced, variable reactance across a pair of circuit terminals, the value of which is controllable.

There is a myriad of uses for a balance reactance circuit having a variable reactance that is controllable. One obvious use for such a circuit, to which the present invention is directed, is to provide a controllable reactance as a portion of an LC reactive tank circuit of an oscillator. By varying the reactance, the total reactance of the tank circuit can be varied to cause a change in the center operating frequency of the oscillator. The oscillator, in turn, may be utilized in the FM or video detector stages of a television receiver.

Contemporary technology is driving television receivers to be manufactured as single monolithic integrated circuitry. As such, the FM and video detector portion of the television receiver, to the extent possible, has to be integratable in order to produce a single monolithic chip circuit. The requirement also dictates that the detector oscillator of the video detection circuitry be as simple as possible; the less complex the circuitry the more room that is available on board the integrated chip for additional components of the television receiver. One method that has been proposed is the use of a LC oscillator operating at a center frequency that can be tuned within a predetermined range. The oscillator is tuned by electronically varying the reactance of the LC tank circuit of the oscillator. In particular, by varying the capacitance value of the LC tank, the oscillator's center frequency is changed. Therefore, a requirement for an integrated variable reactance circuit is established.

A prior art single ended variable capacitance circuit, U.S. Pat. No. 4,109,214, produces a single-ended variable capacitance at an output terminal thereof. However, because of the balanced nature of the oscillator that is required for performance in television receivers, the single-ended capacitive circuit of the prior art is not useful. Additionally, the prior art circuit requires that signal components be dissipated to ground which is undesirable in quality television receivers due to the fact that such grounded signals could be picked up and reproduced within the receiver to cause distortion of the received television signal.

Therefore, a need exists for a balanced variable reactance circuit the value of reactance being made electronically variable.

SUMMARY OF THE INVENTION

Accordingly, it is an object of the present invention to provide a variable reactance circuit.

Another object of the present invention is to provide a method for producing a variable reactance.

Still another object of the present invention is to provide a monolithic integrated variable reactance circuit the value of the reactance being controllable.

A further object of the present invention is to provide a monolithic integrated variable capacitance circuit.

In accordance with the above and other objects there is provided a balanced, variable reactance circuit comprising a pair of current steering circuits each having a pair of control terminals, a pair of output terminals and a common terminal, the pair of control terminals and output terminals of the first one of the pair of current steering circuits being cross coupled respectively to the pair of control terminals and the output terminals of the second one of the pair of current steering circuits, each one of the pair of current steering circuits steering differential and proportional currents between the outputs thereof in response to receiving a control signal across the pair of control terminals thereof, a first reactive circuit element coupled between one of the output terminals of the first current steering circuit and the common terminal, and a second reactive circuit element coupled between one output terminal of the second current steering circuit and the common terminal thereof, the first and second reactive circuit elements sourcing first and second antiphased reactive currents to the respective common terminals in response to antiphased alternating voltage signals being applied between the respective one output terminals.

DETAILED DESCRIPTION OF THE PREFERRED EMBODIMENTS

Figure 1:
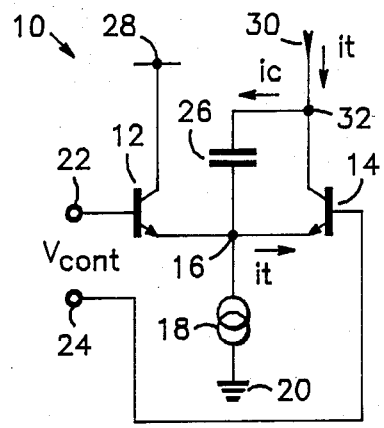
FIG. 1 is a schematic diagram illustrating a prior art, variable capacitive circuit.
Figure 2:
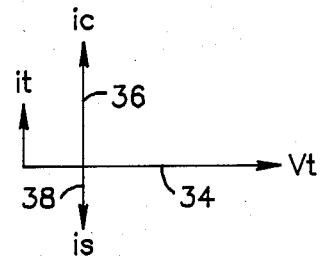
FIG. 2 is a vector diagram useful for understanding the operation of FIG. 1.

Turning to FIGS. 1 and 2 the description of prior art variable capacitive circuit 10 is described. The operation of variable capacitive circuit 10 is useful for understanding the operation of the balanced, variable reactance circuits of the embodiments of the present invention. Capacitive circuit 10 comprises a pair of NPN transistors 12 and 14 the emitters of which are commonly connected in a differential manner at common circuit node 16. A current source 18 is coupled between node 16 and a power supply conductor at which is supplied ground reference potential 20. The base electrodes of transistors 12 and 14 are coupled respectively to a pair of terminals 22 and 24 across which a direct current (DC) control voltage, $V_{CONT}$ is supplied for differentially controlling the conduction of the two transistors in order to steer proportional currents therebetween. The collectors of transistors 12 and 14 are coupled to first and second terminals 28 and 30 (with the collector of transistor 12 being at alternating current, AC, ground) to a source of operating potential accordingly. A capacitor having a capacitive value, C, is connected between the collector and emitter of transistor 14, between nodes 32 and 16. It is understood that circuit 10, including capacitor 26, can be manufactured in monolithic integrated circuit form.

In operation, variable capacitive circuit 10 functions as a current steering circuit whereby the effective capacitance value produced at node 32 is varied as the conductivity of transistor 14 is controlled by varying $V_{CONT}$. In response to an alternating voltage, $V_t$, applied at terminal 30, a reactive current, $i_t$, flows into and out of node 32 to produce current flow through capacitor 26 equal to $i_c$. As shown in the vector diagram of FIG. 2, $i_c$ splits at common node 16 and is sourced through transistors 12 and 14 accordingly. With transistor 14 conducting, the current $i_s$ (vector 38) that is fed back through transistor 14 appears at the collector thereof, at node 32, in antiphase to the collector current, $i_c$. Hence, the total current, $i_t$, can be shown to be equal to:

$$i_t = (i_c - i_s)$$

Therefore, with transistor 12 rendered fully conductive and transistor 14 fully nonconductive, all of the current $i_c$ flows into common node 16 which is at alternating ground reference. Because transistor 14 is turned off, the current $i_s$ equals zero and therefore the current $i_t$ is equal to the current $i_c$ (see the above equation). Thus, the effective capacitance looking into node 32 is equal to the value of capacitor 26, or in other words;

$$C_{eff} = C,$$

where C is the capacitance value of capacitor 26.

At the balanced operating condition of circuit 10, where transistors 12 and 14 are equally conducting, the current $i_c$ is equally split or steered therebetween. In this condition, $i_s$ is equal to one half $i_c$. Since the current $i_s$ is antiphase to the current $i_c$, $i_t$ becomes equal to one-half the value $i_c$. This produces an effective capacitance at terminal 30 of;

$$C_{eff} = C/2$$

The value of capacitance 32 therefore appears to have been reduced by one-half its original value. Similarly, as the DC control voltage $V_{CONT}$ is varied to fully turn on transistor 14 (while transistor 12 is turned off) the effective capacitance at node 32 becomes zero since the current $i_s$ becomes equal to but opposite in phase to the current $i_c$.

Figure 3:
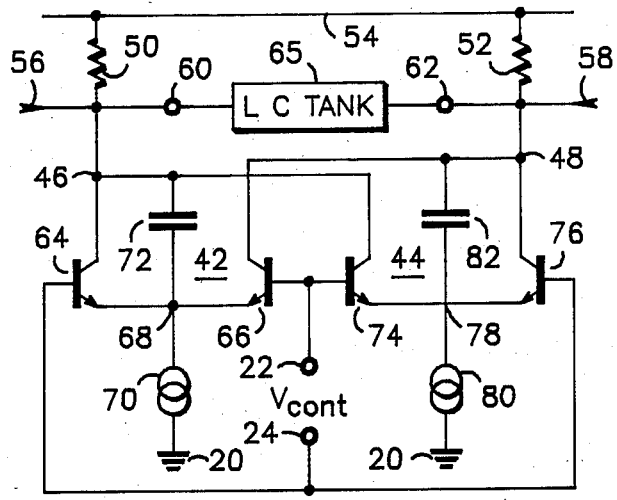
FIG. 3 is a schematic diagram illustrating a balanced variable reactance circuit of the present invention.

Turning now to the remaining FIGS. the operation of the particular embodiments of the present invention will be described with reference to the operation of the variable capacitance circuit of FIG. 1. Referring first to FIG. 3, there is illustrated balanced variable reactance circuit 40 of one embodiment of the invention. Variable reactance circuit 40 includes a pair of current steering circuits 42 and 44 each of which individually operates in a similar manner described above for single ended variable reactance circuit 10 but which produce a balanced, variable reactance across first and second terminals thereof. Current steering circuits 42 and 44 each have a pair of outputs coupled to nodes 46 and 48, and via resistors 50 and 52, to power supply conductor 54 at which is received an operating potential, $V_{CC}$. Nodes 46 and 48 are connected to first and second terminals 56 and 58 across which the aforementioned balanced variable reactance is produced by variable reactance circuit 40 as will be hereinafter discussed. Terminals 56 and 58 may be coupled to an oscillator circuit (not shown) that is coupled at external terminals 60 and 62 to tuned LC tank circuit 65 as previously discussed. The tank circuit sets the center operating frequency of the oscillator; the oscillator and variable reactance circuit 40 being suited to be manufactured in monolithic integrated circuit form.

First current steering circuit 42 comprises NPN transistors 64 and 66 which are responsive to the control voltage $V_{CONT}$ applied across the bases of the two pair of transistors for steering the capacitive current sourced to common node 68 from capacitor 72 therethrough to nodes 46 and 48 accordingly. Common circuit node 68 is coupled to current source 70 the latter being returned to direct current (DC) reference potential 20. The currents steered through the individual transistors 64 and 66 are proportional to each other and appear at nodes 46 and 48 as two inphase current signals. Hence, in response to an alternating current (AC) driving voltage applied at terminal 60, a pair of proportional, inphase current signals are produced at nodes 46 and 48 the relative magnitudes of which are dependent on the relative conductivity of the two transistors 64 and 66. The portion of the capacitor current that is steered through transistor 64 to node 46 will be of opposite phase to the capacitive current flowing through capacitor 72 and tend, therefore, to cancel the latter at node 46.

Similarly, second current steering circuit 44 comprises a pair of NPN transistors 74 and 76 the emitters of which are connected at common circuit node 78 and, via current source 80, to DC reference potential 20. It is understood that during operation, common circuit nodes 68 and 78 are at AC ground. A driving voltage is applied at node 48 from terminal 62, which is of antiphase relation to the driving voltage applied at node 60, produces a capacitive current through capacitor 82 to node 78, that is steered between transistors 74 and 76 thereby establishing proportional and inphase current signals at the respective collectors thereof which are coupled to nodes 46 and 48. Again, the relative magnitudes of the two currents flowing through the collectors of transistors 74 and 76 vary as the relative conductivity thereof is varied by $V_{CONT}$. As understood, since the base of transistor 74 is coupled to the base of transistor 66 it operates in phase therewith and in antiphase with respect to transistor 64 such that the currents steered through transistors 74 and 76, which are sourced to nodes 46 and 48 respectively, are antiphased to the currents steered through transistors 64 and 66 and therefore tend to cancel each other.

In operation then, with a pair of equal but oppositely phased driving voltage signals applied at terminals 60 and 62, across tank circuit 65, a pair of antiphased capacitive currents are produced through capacitors 72 and 82 accordingly. These capacitive currents are summed with the current steered through the current steering circuits 42 and 44, at nodes 46 and 48, to produce an effective capacitance thereacross having a value that is electronically varied by varying the control voltage $V_{CONT}$. For example, at a balanced operating condition, where transistors 64 and 66 and 74, 76 are all conducting equally, the currents steered through transistors 64 and 74 cancel each other as do the currents steered through transistors 66 and 76. Thus, only the direct capacitive currents flow through capacitors 72 and 82. This produces an effective capacitance across terminals 60 and 62 equal to the value, C/2; where C is the value of capacitors 72 and 82. It can be shown that the value of this effective capacitance which appears across tank circuit 65 varies from a value equal to zero to a maximum value of C as the control voltage, $V_{CONT}$, is varied over its full control range and transistors 64 and 76 go from a full conductive state to a nonconducting state. Hence, by varying the DC control voltage on the bases of these transistors, the effective capacitance of tank circuit 65 is varied which, in turn, would vary the center operating frequency of the LC oscillator coupled across terminals 56 and 58 as is understood.

Figure 4:
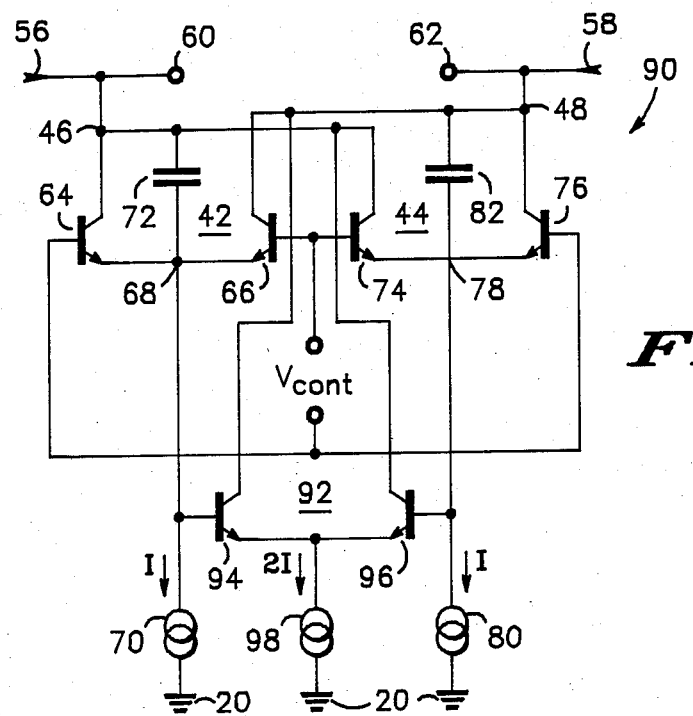
FIG. 4 is a schematic diagram of a variable reactance circuit of another embodiment of the present invention.

Referring now to FIG. 4 there is illustrated variable reactance circuit 90 which operates as described above with reference to variable reactance circuit 40 but which in addition eliminates the direct capacitive currents from flowing through tank circuit 65 during the balanced operating state of the two current steering circuits 42 and 44. It is to be understood in the following description that components of the variable reactance circuit 90 which correspond to like components of variable reactance circuit 40 will be designated by the same referenced numbers.

In normal operation, the variable reactance circuits of the present invention described hereinafter are intended to be operated in balanced operating state whereby a predetermined value of capacitance is established across the first and second terminals 56 and 58. Therefore, it is desirable in some cases to eliminate the effect of the integrated capacitors of the variable reactance circuits from appearing directly across the tank circuit in order to prevent undesirable affects, such as any temperature coefficient associated with integrated capacitors 72 and 82 on the normal operating frequency. For example, if for some reason capacitors 72 and 82 have undesirable temperature coefficients associated therewith due to their being fabricated in monolithic circuit form, the center frequency and perhaps the Q of the tank circuit may be adversely affected. By eliminating the direct capacitive current at the center operating frequency from flowing through tank circuit 65, the effective capacitance across the tank at balance is zero. Thus, the normal operating frequency and Q of the tank circuit will be unaffected by the capacitors.

As illustrated in FIG. 4, differential amplifier 92 includes a pair of differentially connected NPN transistors 94 and 96 that are coupled to current source 98. The first and second inputs (bases of transistors 94 and 96) of amplifier 92 are coupled respectively to the common nodes 68 and 78 of the current steering circuits 42 and 44. The outputs (collectors of transistors 94 and 96) of amplifier 92 are connected respectively to nodes 48 and 46. As shown, the value of current sourced through current source 98 is twice that of the current sourced through either current source 70 or 80.

At the balanced operating state, the bases of transistors 94 and 96 are modulated by the AC signals appearing across capacitors 72 and 82 to produce collector currents through the two transistors which are equal in amplitude but opposite in phase to the capacitive currents summed therewith. Hence, for example, the current flowing through capacitor 72, through transistor 66 to node 48, is cancelled by the collector current of transistor 94 and therefore does not appear across tank circuit 65 (which is shown in FIG. 3 as being coupled between nodes 60 and 62) at terminal 62. In operation the value of reactance of variable reactance circuit 90 varies from a negative reactance value equal to C/2 to a positive reactance value equal to C/2 as the voltage $V_{CONT}$ is varied over a predetermined range. The effective reactance value at the midrange value of $V_{CONT}$, i.e., the balance operating state of transistor 64, 66, 74 and 76 is, as aforementioned, equal to zero.

Figure 5:
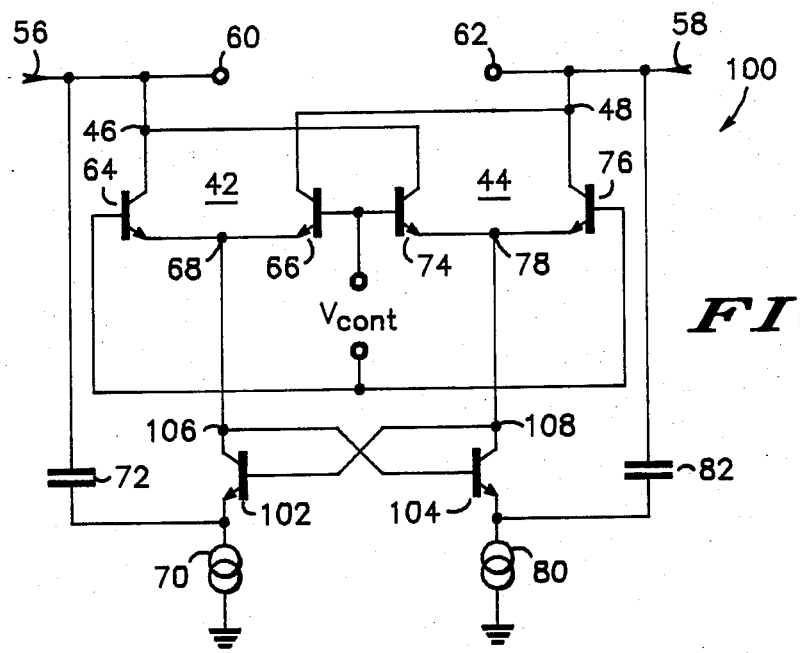
FIG. 5 is a schematic diagram of still another embodiment of the present invention.

Variable reactance circuit 100 of FIG. 5 eliminates the effect of the dynamic emitter resistances, re, of each transistor of the current steering circuit 42 and 44 on the circuit performance. For example, at balance, the direct capacitive current flowing through capacitor 72 (FIG. 3) also flows through the emitter-collector path of transistor 66 to node 48. The value of the dynamic emitter resistance of transistor 66 will therefore cause the resultant reactive current to lag the ideal capacitive current by some factor. This action can effect the operating frequency of the tank circuit 65 as well as the Q thereof. The addition of transistors 102 and 104, having their collector-emitter paths coupled between common node 68 and 78 respectively and current sources 70 and 80, cancel the dynamic resistance effects of the transistors of the two current steering circuits. As illustrated, the bases of transistors 102 and 104 are cross connected to the common nodes 78 and 68 respectively. Capacitor 72 is connected between node 46 and the emitter of transistor 102. Likewise, capacitor 82 is connected between node 48 and the emitter of transistor 104. In this manner, the capacitors remain coupled between the common nodes and respective terminals of the variable reactance circuit 100. Transistors 102 and 104 establish virtual grounds at nodes 106 and 108 whereby the dynamic emitter resistances of the transistors cancel each other. Thus, the undesired effect of the transistors dynamic emitter resistances is eliminated. It is understood that the embodiments shown in FIGS. 4 and 5 can be combined into a single variable reactance circuit embodying the two concepts described separately.

Figure 6:
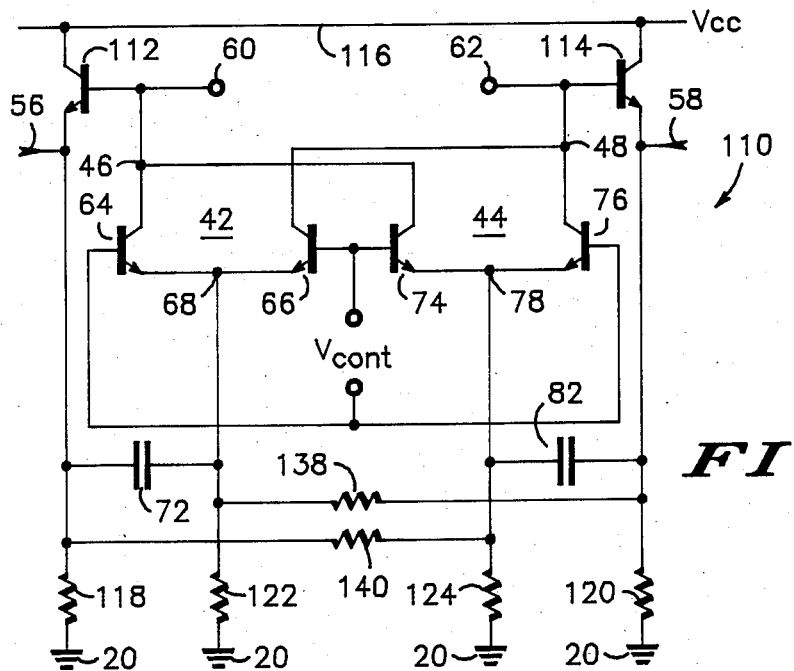
FIG. 6 is a schematic diagram of the preferred embodiment of the present invention.
Figure 7:
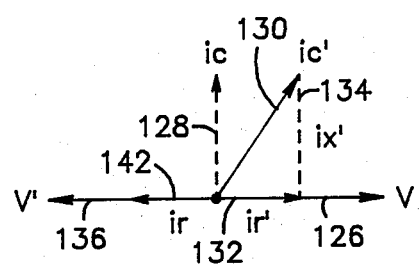
FIG. 7 is a vector diagram useful for understanding the operation of the circuit of FIG. 6.

Referring now to FIGS. 6 and 7 there is shown variable reactance circuit 110 of the preferred embodiment of the invention which combines the features of variable reactance circuits 90 and 100. Thus, at the center operating frequency no direct capacitive current flows through tank circuit 65 from terminals 60 and 62 thereby eliminating the temperature coefficient affects of the integrated capacitors 72 and 82. Additionally, the dynamic emitter resistances of transistors 64, 66, 74, 76, 112 and 114 are compensated for as well as any series resistance associated with capacitors 72 and 82 in order to prevent loading on tuned tank circuit 65 as will be hereinafter described.

As illustrated, a pair of emitter follower transistors 112 and 114 have their respective base-emitter paths connected between nodes 46 and 48 to one side of capacitor 72 and 82. The other side of capacitor 72 and 82 are returned at common nodes 68 and 78 as described above. The collectors of transistors 112 and 114 are coupled to positive power supply conductor 116 to a source of operating potential $V_{CC}$ whereby capacitors 72 and 82 are isolated from but electronically coupled across tank circuit 65 at terminal 60 and 62. The conduction paths for transistors 112 and 114 are via respective resistors 118 and 120 to a second power supply conductor at which is supplied ground reference 20. Resistors 122 and 124 may correspond to current sources 70 and 80 previously described.

Again, a pair of antiphased AC voltage drive signals V and V' (FIG. 7) are applied at nodes 46 and 48, across tank circuit 65 (which is shown in FIG. 3 as being coupled between nodes 60 and 62), to produce two antiphased capacitive currents through capacitors 72 and 82 respectively, which currents are sourced from the respective collector-emitter paths of transistor 112 and 114. Transistors 112 and 114 thus have the effect of removing the direct capacitive currents from flowing through tank circuit 65 during the balance operating condition of the circuit. As illustrated in FIG. 7, the AC driving voltage, V (vector 126), that is applied at terminal 60 will ideally produce a capacitive current $i_c$ (vector 128) through transistor 112 that leads the voltage V by 90 degrees. However, among other things, the dynamic emitter resistance of the transistors will cause the actual capacitive current, $i_c'$ (vector 130) to lag $i_c$ by some angle depending on the value of $i_r'$, the resistive component of $i_c'$. It is understood that driving voltage V' (vector 136), will produce a similar antiphase capacitive current through capacitor 82.

In order to prevent loading of tuned tank circuit 65 due to the resistive component $i_r'$ flowing through capacitor 72 and its counterpart that is associated with capacitor 82, resistors 138 and 140 are connected respectively between common circuits node 68 and 78 and junctions 58 and 56. Thus, for example, the current flowing through transistor 114 produces direct capacitive current through capacitor 82 and a current through resistor 138. The current through resistor 138 will be in opposite phase to the resistive component of current flowing through capacitor 72 and therefore when this current is summed therewith, at node 68, the effect of these two resistive currents are cancelled. The resultant current becomes capacitive (vector 128) and equal to $i_c$. Similarly, the current flowing through resistor 140 is of opposite phase to the resistive component of current flowing through capacitor 82 and will therefore cancel each other at node 78 to produce a resultant capacitive current. Thus, at the center operating frequency of tank 65, with current steering circuits 42 and 44 being operated in a balanced operating state, variable reactance circuit 110 has no effect on the tuned circuit 65. However, as $V_{CONT}$ is varied above and below the value that establishes the balance operating condition, an effective capacitance is produced across the tank circuit which causes the center operating frequency thereof to vary in the same manner as discussed with reference to variable reactance circuit 90.

Hence, what has been described above are novel balanced variable reactance circuits suitable for being manufactured in monolithic integrated circuit form for providing a variable and controllable capacitance across a pair of terminals. In the preferred embodiment, the variable reactance value is substantially made equal to zero at the balanced operating condition of the circuit and therefore has no effect upon any load coupled thereto, such as a tuned LC tank circuit. Thus, the variable reactance circuit will not degrade performance of the tank circuit at the center operating frequency thereof.

We claim:

1. A circuit for producing a controllable and variable reactance across first and second terminal, comprising:
   first current steering means having a common terminal for steering first and second proportional currents to the first and second terminals from said common terminal in response to receiving an applied control signal;
   second current steering means having a common terminal for steering third and fourth proportional currents to the first and second terminals from said common terminal in response to said applied control signal, said first and third currents being in antiphased relationship with respect to each other;
   first reactive means coupled between the first terminal and said common terminal of said first current steering means for sourcing a first reactive current to said common terminal; and
   second reactive means coupled between the second terminal and said common terminal of said second current steering means for sourcing a second reactive current to said common terminal, said second reactive current being in antiphase with said first reactive current.

2. The circuit of claim 1 wherein said first current steering means includes first and second transistors each having a base, collector and an emitter, said emitters being connected to said common terminal, said collectors being coupled respectively to the first and second terminals, said bases receiving said control signal.

3. The circuit of claim 2 wherein said second current steering means includes third and fourth transistors each having a base, collector and an emitter, said emitters being connected to said common terminal, said collectors being coupled respectively to the first and second terminals, said base of said third transistor being coupled to said base of said second transistor and said base of said fourth transistor being coupled to said base of said first transistor.

4. The circuit of claim 3 wherein each one of said first and second current steering means includes a substantially constant current source coupled between said common terminal and a direct current ground reference.

5. The circuit of claim 4 further including differential amplifier means having first and second inputs and outputs, said first and second inputs being coupled respectively to said common terminals of said first and second current steering means and first and second outputs being coupled respectively to the second and first terminals.

6. The circuit of claim 4 further including:
   a fifth transistor having a base, collector and emitter, said collector being connected to said common terminal of said first current steering means, said emitter being connected both to said substantially constant current source of said first current steering means and to said first reactive means for coupling said first reactive means to said common terminal, and said base being connected to said common terminal of said second current steering means; and
   a sixth transistor having a base, collector and emitter, said collector being connected to said common terminal of said second current steering means, said emitter being connected both to said substantially constant current source means of said second current steering means and said second reactive means for coupling said second reactive means to said common terminal, and said base being connected to said collector of said fifth transistor.

7. The circuit of claim 4 further including:
   first current source means coupled with the first terminal for sourcing current to said first reactive means;
   second current source means coupled with the second terminal for sourcing current to said second reactive means;
   first resistive means coupled between said common terminal of said second current steering means and said first current source means; and
   second resistive means coupled between said common terminal of said first current steering means and said second current source means.

8. The circuit of claim 7 wherein said first current source means includes a fifth transistor having a base, collector and an emitter, said base being coupled to the first terminal, said collector receiving an applied operating potential, said emitter being coupled to said first reactive means and said first resistive means.

9. The circuit of claim 8 wherein said second current source means includes a sixth transistor having a base, collector and an emitter, said base being coupled to the second terminal, said collector receiving said operating potential, said emitter being coupled to said second reactive means and said second resistive means.

10. The circuit of claim 9 further including:
third resistive means coupled between said emitter of said fifth transistor and direct current ground reference; and
fourth resistive means coupled between said emitter of said sixth transistor and said direct current ground reference.

11. A monolithic integrated, balance variable reactance circuit for providing a controllable reactance between first and second terminals, comprising:
first current steering means having first, second and common terminals, said first current steering means being responsive to an applied control signal for steering first and second proportional currents to said first and second terminals respectively, said first and second terminals of said first current steering means being coupled to the first and second terminals of the balanced reactance circuit respectively;
second current steering means having first, second and common terminals, said second current steering means being responsive to said applied control signal for steering first and second proportional terminal to said first and second terminals thereof, said first terminal being coupled to said first terminal of said first current steering means and said second current being coupled to said second terminal of said first current steering means, said first and second proportional currents being in antiphase relation with respect to said first and second proportional currents of said first current steering means;
first reactive means coupled between said common terminal and said first terminal of said first current steering means; and
second reactive means coupled between said common terminal and said second terminal of said second current steering means.

12. The circuit of claim 11 wherein said first and second reactive means are first and second capacitive means.

13. The circuit of claim 12 including:
first and second power supply conductors;
a first transistor having a base coupled to said first terminal of said first current steering means, a collector coupled to said first power supply conductor, and an emitter coupled to said first capacitive means whereby said first capacitive means is indirectly coupled to the first terminal of the balanced reactance circuit;
a second transistor having a base coupled to said second terminal of said current steering means, a collector coupled to said first power supply conductor, and an emitter coupled to said second capacitive means whereby said second capacitive means is indirectly coupled to the second terminal of the balanced reactance circuit; and
said common terminals of said first and second current steering means being coupled to said second power supply conductor.

14. The circuit of claim 13 further including:
first resistive means coupled between said common terminal of said first current steering means and said emitter of said second transistor; and
second resistive means coupled between said common terminal of said second current steering means and said emitter of said first transistor.

15. The circuit of claim 14 including:
third resistive means coupled between said emitter of said first transistor and said second power supply conductor; and
fourth resistive means coupled between said emitter of said second transistor and said second power supply conductor.

16. The circuit of claim 14 wherein said first current steering means includes:
third and fourth transistors each having a base, collector and an emitter, said emitters being connected to said common terminal, said bases receiving said applied control signal thereacross, said collector of said third transistor being connected to said first terminal and said collector of said fourth transistor being connected to said second terminal; and
current source means coupled between said common terminal and said second power supply conductor.

17. The circuit of claim 16 wherein said second current steering means includes:
fifth and sixth transistors each having a base, collector and an emitter, said emitters being connected to said common terminal, said collector of said fifth transistor being connected to said first terminal, said collector of said sixth transistor being coupled to said second terminal, said base of said fifth transistor being coupled to said base of said fourth transistor and said base of said sixth transistor being coupled to said base of said third transistor; and
current source means coupled between said common terminal and said second power supply conductor.

18. A method for producing a variable and controllable reactance across a pair of terminals, comprising the steps of:
producing first and second antiphased reactive currents;
producing first and second proportional currents from said first reactive current;
producing third and fourth proportional currents from said second reactive current;
summing said first reactive current, said first and third currents at a first one of said pair of terminals, said first and third currents being antiphased with respect to each other with said first current being in antiphase relation with said first reactive current; and
summing said second reactive current, said second and fourth currents at the second one of the pair of terminals.

19. The method of claim 18 further including varying the proportionality of said first and second currents with respect to each other while simultaneously varying the proportionality of said third current with respect to said fourth current.

* * * * *

UNITED STATES PATENT AND TRADEMARK OFFICE
CERTIFICATE OF CORRECTION

PATENT NO.  : 4,638,265

DATED       : January 20, 1987

INVENTOR(S) : Gerald Lunn, Eric Main and Michael McGinn

It is certified that error appears in the above-identified patent and that said Letters Patent is hereby corrected as shown below:

Column 9, claim 11, line 36, change "terminal" (first word) to -- currents --.

Column 9, claim 11, line 39, change "current" to -- terminal --.

Signed and Sealed this

Tenth Day of September, 1991

Attest:

HARRY F. MANBECK, JR.

*Attesting Officer*  *Commissioner of Patents and Trademarks*